(12) United States Patent
Hayashi et al.

(10) Patent No.: US 8,044,557 B2
(45) Date of Patent: Oct. 25, 2011

(54) PIEZOELECTRIC DEVICE AND ITS MANUFACTURING METHOD

(75) Inventors: Michihiko Hayashi, Fukui (JP); Masahiro Yasumi, Osaka (JP); Shoji Okamoto, Osaka (JP)

(73) Assignee: Panasonic Corporation, Osaka (JP)

( * ) Notice: Subject to any disclaimer, the term of this patent is extended or adjusted under 35 U.S.C. 154(b) by 36 days.

(21) Appl. No.: 12/596,867

(22) PCT Filed: Apr. 24, 2008

(86) PCT No.: PCT/JP2008/001074
§ 371 (c)(1),
(2), (4) Date: Oct. 21, 2009

(87) PCT Pub. No.: WO2008/132847
PCT Pub. Date: Nov. 6, 2008

(65) Prior Publication Data
US 2010/0117493 A1    May 13, 2010

(30) Foreign Application Priority Data

Apr. 24, 2007 (JP) .................................. 2007-113726
Apr. 7, 2008 (JP) .................................. 2008-099029

(51) Int. Cl.
*H01L 41/08* (2006.01)
(52) U.S. Cl. ....................................... 310/364; 310/370
(58) Field of Classification Search .................. 310/363, 310/364, 366, 370, 344, 348
See application file for complete search history.

(56) References Cited

U.S. PATENT DOCUMENTS

| 6,294,860 | B1 | 9/2001 | Shimada et al. |
| 7,185,540 | B2 * | 3/2007 | Torii et al. .................. 73/504.16 |
| 7,245,064 | B2 * | 7/2007 | Takeuchi et al. .............. 310/370 |
| 7,378,778 | B2 * | 5/2008 | Ikeda et al. ..................... 310/331 |
| 7,589,458 | B2 * | 9/2009 | Aratake .......................... 310/370 |
| 7,845,063 | B2 * | 12/2010 | Kawashima .................... 29/594 |
| 2003/0231082 | A1 | 12/2003 | Takata et al. |

FOREIGN PATENT DOCUMENTS

| JP | 58-188916 | 11/1983 |
| JP | 64-030273 | 2/1989 |
| JP | 5-013364 | 1/1993 |
| JP | 6-112155 | 4/1994 |
| JP | 9-074169 | 3/1997 |
| JP | 2003-227719 | 8/2003 |
| JP | 2004-006673 | 1/2004 |
| JP | 2005-249645 | 9/2005 |
| JP | 2006-339663 | 12/2006 |

OTHER PUBLICATIONS

International Search Report issued Aug. 5, 2008 in International (PCT) Application No. PCT/JP2008/001074.

* cited by examiner

*Primary Examiner* — Mark Budd
(74) *Attorney, Agent, or Firm* — Wenderoth, Lind & Ponack, L.L.P.

(57) ABSTRACT

An upper adhesion layer 35 formed between a piezoelectricity layer 32 and an upper electrode layer 34 so as to abut on the piezoelectricity layer 32 and the upper electrode layer 34 is included. The upper adhesion layer 35 includes a first tungsten layer 47 made of tungsten in which an α phase and a β phase coexist and a second tungsten layer 48 made of α-phase tungsten. The first tungsten layer 47 is configured so as to abut on the piezoelectricity layer 32. It is possible to obtain a piezoelectric device which is capable of improving the adhesion property of both the piezoelectricity layer and the electrode layer and reducing a basic point voltage fluctuation at the time of high-temperature operation so as to improve reliability.

3 Claims, 10 Drawing Sheets (COUNTERCLOCKWISE
DIRECTION)

PIEZOELECTRIC DEVICE AND ITS MANUFACTURING METHOD

TECHNICAL FIELD

The present invention relates to a piezoelectric device used as a head for an ink jet printer or an inertial sensor including an angular velocity sensor used in various electronic apparatuses such as a vehicle navigation system or attitude control, and a method of manufacturing the same.

BACKGROUND ART

FIG. 10 is a perspective view of a detection element of an angular velocity sensor as one type of a conventional piezoelectric device disclosed in Patent Document 1, and FIG. 11 is a cross-sectional view taken along line 11-11 of FIG. 10.

The conventional angular velocity sensor includes tuning fork type detection element 1 shown in FIG. 10 and a signal processing circuit (not shown) for processing a signal output from detection element 1 and calculating an angular velocity. As shown in FIG. 10, detection element 1 is configured by a tuning fork type in which a pair of facing arms 2 is connected by connection portion 3, and connection portion 3 is mounted in a mounting substrate and is used. Driving portions 4 for driving arms 2, detecting portion 5 for outputting an angular velocity signal generated due to the angular velocity applied to detection element 1, and monitor portion 6 for monitoring the driving state of detection element 1 are arranged in each of the pair of arms 2. In the arrangement, two driving portions 4 are arranged with one detecting portion 5 interposed therebetween and monitor portion 6 is arranged in the vicinity of the boundary between each of arms 2 and connection portion 3, in the opposite directions of arms 2.

As shown in FIG. 11, each of the pair of arms 2 has silicon substrate 9 having two layers including silicon layer 7 and silicon oxide layer 8 obtained by oxidizing the surface thereof, and driving portions 4 and detecting portion 5 are formed on silicon substrate 9 with intermediate layer 10 interposed therebetween. Each of driving portions 4 and detecting portion 5 includes lower electrode layer 12 and upper electrode layer 13 with piezoelectricity layer 11 interposed therebetween. Adhesion layer 14 is formed between piezoelectricity layer 11 and upper electrode layer 13.

Intermediate layer 10 is made of titanium (Ti), and lower electrode layer 12 is made of Pt—Ti mainly made of platinum (Pt) containing Ti. Piezoelectricity layer 11 includes two layers including alignment control layer 15 mainly made of lead titanate and PZT layer 16 made of lead zirconate titanate and laminated on alignment control layer 15. Adhesion layer 14 is made of Ti, and upper electrode layer 13 is made of Au.

Recently, the angular velocity sensor has been used in extremely high-temperature environments such as the inside of an engine room as well as a cabin of a vehicle which a person gets in and out of. Accordingly, the reliability of the angular velocity sensor needs to be further improved at a high temperature.

If conventional detection element 1 having the above configuration is used at a high temperature as in the vicinity of an engine, interaction occurs between Ti constituting adhesion layer 14 formed between piezoelectricity layer 11 and upper electrode layer 13 of detection element 1 and PZT layer 16 constituting piezoelectricity layer 11. Accordingly, the dielectric constant, the specific resistance or the piezoelectric constant of the interface of piezoelectricity layer 11 is changed with time and detection sensitivity is changed.

FIG. 12 is a characteristic diagram showing a change in the basic point voltage fluctuation of the same angular velocity sensor at a high temperature with the elapse of time. In the angular velocity sensor using detection sensor 1, as shown in FIG. 12, as an operation time at a high temperature (an operation of 5 V at 125 degrees Celsius) is increased, a basic point voltage which is a voltage generated in the angular velocity sensor when an angular velocity is not applied is significantly changed.

Accordingly, in the conventional piezoelectric device, as can be seen from the characteristic diagram showing an output voltage change against an angular velocity change of the angular velocity sensor of FIG. 13, a voltage when an angular velocity is not generated is changed from the basic point voltage (point V0) to, for example, point V1 of a minus side, and an error of A° C./sec occurs.

However, in the piezoelectric vibrator field, a vibrator is composed of a piezoelectric substance, electrodes are respectively formed on two opposite surfaces of the piezoelectric substance, and tungsten is used as the underlying layers of the electrodes. In this piezoelectric vibrator, in order to prevent the piezoelectric substance as well as the electrodes from being trimmed when the electrodes are laser-trimmed in order to adjust a resonance frequency, tungsten, a metal with a high melting point, is used as the underlying layers of the electrodes (see Patent Document 2).

Although it relates to the semiconductor field, there is a technology that, in order to form a T-shaped electrode on a semiconductor substrate, tungsten in which an α phase and a β phase coexist and α-phase tungsten, and thereon tungsten having the α phase are formed on the semiconductor substrate and processed by etching. In this technology, the T-shaped electrode is obtained by focusing on a difference in the etching rates of the α-phase tungsten and the β-phase tungsten, forming tungsten in which an α phase and a β phase coexist with a higher etching rate on a lower side and forming the α-phase tungsten with a lower etching rate on an upper side (see Patent Document 3).

[Patent Document 1] Japanese Patent Unexamined Publication No. 2005-249645

[Patent Document 2] Japanese Patent Unexamined Publication No. 58-188916

[Patent Document 3] Japanese Patent Unexamined Publication No. 64-30273

SUMMARY OF THE INVENTION

The present invention is to solve the conventional problems and is to provide a piezoelectric device, such as an angular velocity sensor, which is capable of improving reliability by improving the adhesion property of both a piezoelectricity layer and an electrode and decreasing a basic point voltage fluctuation at the time of a high-temperature operation, and a method of manufacturing the same.

The present invention includes a substrate, a lower electrode layer formed on the substrate, a piezoelectricity layer formed on the lower electrode layer, an upper electrode layer formed on the piezoelectricity layer, and any one or both of a lower adhesion layer formed between the piezoelectricity layer and the lower electrode layer so as to abut on the piezoelectricity layer and the lower electrode layer or an upper adhesion layer formed between the piezoelectricity layer and the upper electrode layer so as to abut on the piezoelectricity layer and the upper electrode layer. Each of the upper adhesion layer and the lower adhesion layer includes a first tungsten layer made of tungsten in which an α phase and a β phase coexist and a second tungsten layer made of α-phase tungsten, and the first tungsten layer is configured so as to abut on the piezoelectricity layer.

By this configuration, since the first tungsten layer has excellent adhesion properties with respect to the piezoelectricity layer, the electrical connection property of the piezoelectricity layer and the lower electrode layer or the upper electrode layer can be maintained. In addition, since the α phase has a low specific resistance, it is possible to minimize power loss. In addition, since tungsten has little diffusion at a high temperature, it is possible to improve reliability under the use thereof at a high temperature.

The present invention includes a substrate, a lower electrode layer formed on the substrate, a piezoelectricity layer formed on the lower electrode layer, an upper electrode layer formed on the piezoelectricity layer, and any one or both of a lower adhesion layer formed between the piezoelectricity layer and the lower electrode layer so as to abut on the piezoelectricity layer and the lower electrode layer or an upper adhesion layer formed between the piezoelectricity layer and the upper electrode layer so as to abut on the piezoelectricity layer and the upper electrode layer. A portion of the upper adhesion layer and the lower adhesion layer, which abuts on the piezoelectricity layer, is made of tungsten in which an α phase and a β phase coexist, a ratio of tungsten of the β phase is reduced as going away from the piezoelectricity layer, and a portion which abuts on the upper electrode layer or the lower electrode layer is made of α-phase tungsten.

By this configuration, the electrical connection property of the piezoelectricity layer and the lower electrode layer or the upper electrode layer can be maintained. In addition, since the α phase has a low specific resistance, it is possible to minimize power loss. In addition, since tungsten has little diffusion at a high temperature, it is possible to improve reliability under the use thereof at a high temperature.

The present invention includes a substrate, a lower electrode layer formed above the substrate, a piezoelectricity layer formed on the lower electrode layer, an upper electrode layer formed on the piezoelectricity layer, and any one or both of a lower adhesion layer formed between the piezoelectricity layer and the lower electrode layer so as to abut on the piezoelectricity layer and the lower electrode layer or an upper adhesion layer formed between the piezoelectricity layer and the upper electrode layer so as to abut on the piezoelectricity layer and the upper electrode layer. The lower adhesion layer and the upper adhesion layer are configured by the transition of β-phase tungsten to α-phase tungsten after forming β-phase tungsten without heating the substrate.

By this configuration, the electrical connection property of the piezoelectricity layer and the lower electrode layer or the upper electrode layer can be maintained. In addition, since tungsten obtained by the transition of β-phase tungsten formed without heating the substrate to α-phase tungsten is the adhesion layer, it is possible to improve the adhesion property with the piezoelectricity layer.

PREFERRED EMBODIMENTS OF THE INVENTION

Hereinafter, an angular velocity sensor as one type of a piezoelectric device according to an embodiment of the present invention will be described with reference to the accompanying drawings.

Embodiment 1

Figure 1:
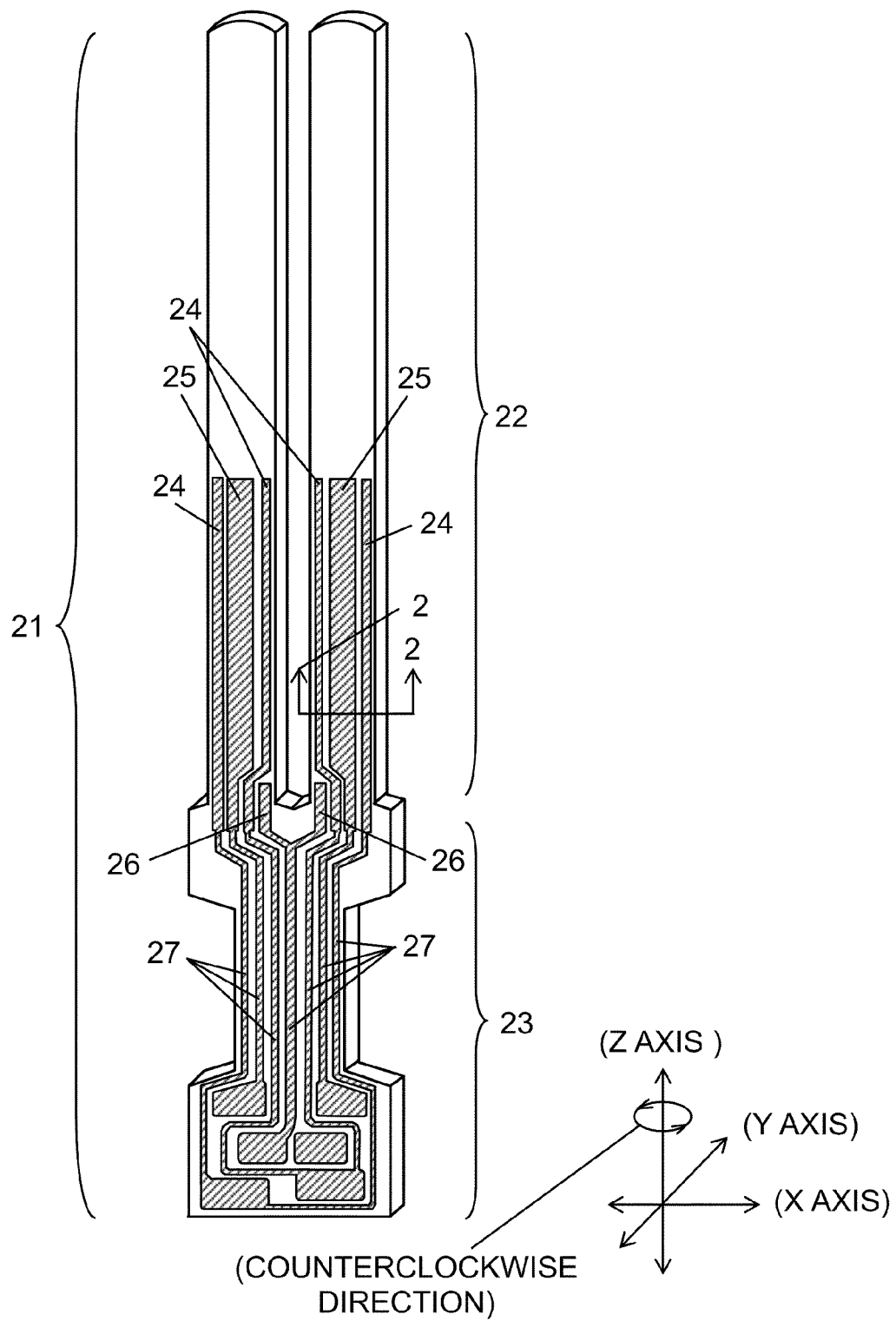
FIG. 1 is a perspective view of a detection element of an angular velocity sensor as one type of a piezoelectric device according to an embodiment of the present invention.
Figure 2:
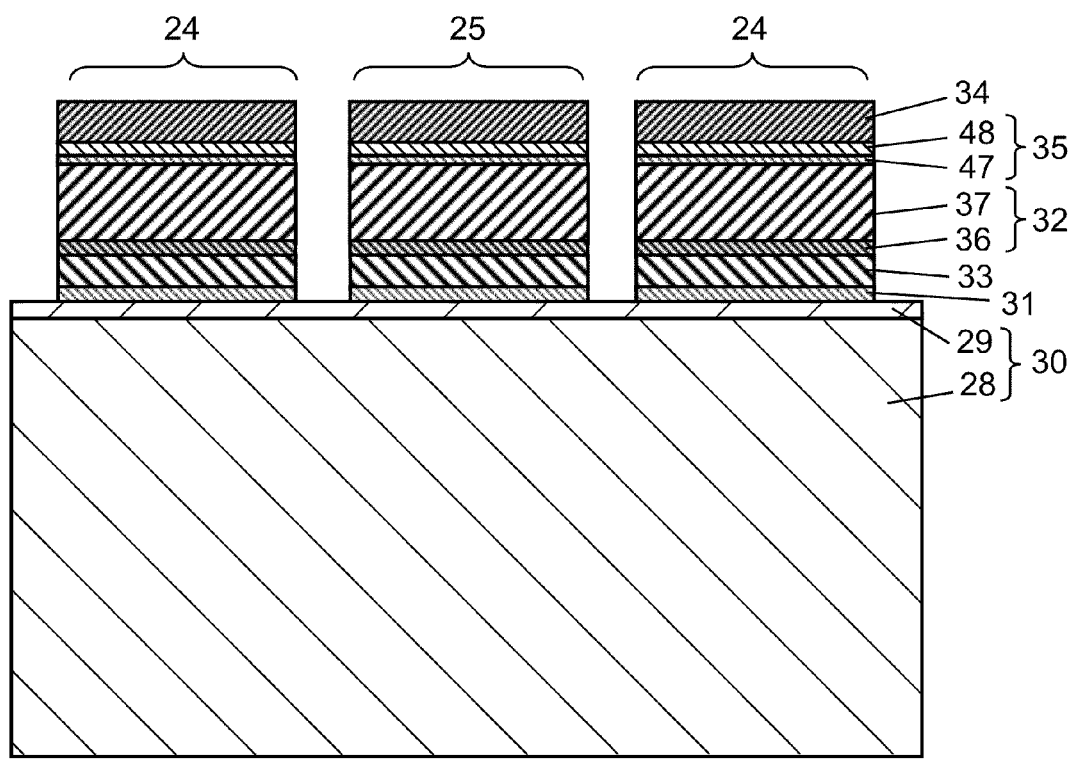
FIG. 2 is a cross-sectional view taken along line 2-2 of FIG. 1.

FIG. 1 is a perspective view of a detection element of an angular velocity sensor as one type of a piezoelectric device according to an embodiment of the present invention, and FIG. 2 is a cross-sectional view taken along line B-B of FIG. 1.

The angular velocity sensor as one type of the piezoelectric device according to the embodiment of the present invention includes tuning fork type detection element 21 and a signal processing circuit (not shown) for processing a signal output from detection element 21 and calculating an angular velocity, as shown in FIG. 1. Detection element 21 is configured by a tuning fork type in which a pair of facing flexible arms 22 is connected by connection portion 23, and connection portion 23 is mounted in a mounting substrate and is used. Driving portions 24 for driving arms 22, detecting portion 25 for outputting an angular velocity signal generated due to the angular velocity applied to detection element 21, and monitor portion 26 for monitoring the driving state of detection element 21 are arranged in the pair of arms 22. In the arrangement, two driving portions 24 are arranged with one detecting portion 25 interposed therebetween and monitor portion 26 is arranged in the vicinity of the boundary between each of arms 22 and connection portion 23, in the opposite directions of arms 22. In addition, routed signal line portions 27 (including an electrode pad, or the like) extending from driving portions 24, detecting portion 25 and monitor portion 26 are arranged.

As shown in FIG. 2, each of the pair of arms 22 has silicon substrate 30 having two layers including silicon layer 28 and silicon oxide layer 29 obtained by oxidizing the surface thereof. In addition, the substrate of the present invention is not specially limited to silicon substrate 30, but silicon substrate 30 will be described by way of example in the following embodiment. Driving portions 24 and detecting portion 25 are formed on silicon substrate 30 with intermediate layer 31 interposed therebetween. Each of driving portions 24 and detecting portion 25 includes lower electrode layer 33 and upper electrode layer 34 with piezoelectricity layer 32 interposed therebetween. Upper adhesion layer 35 is formed between piezoelectricity layer 32 and upper electrode layer 34.

Intermediate layer 31 is formed on silicon oxide layer 29 and is made of titanium (Ti) or titanium oxide (TiO$_x$). Lower electrode layer 33 is formed on intermediate layer 31 and is made of platinum (Pt) and Ti.

Piezoelectricity layer 32 includes two layers including alignment control layer 36 and piezoelectric layer 37. Alignment control layer 36 is formed on lower electrode layer and is made of lead lanthanum titanate (PLT), lanthanum-magnesium-added lead titanate (PLMT), or the like. Piezoelectric layer 37 is formed on alignment control layer 36 and is made of lead zirconate titanate (PZT).

Upper adhesion layer 35 includes first tungsten layer 47 and second tungsten layer 48. First tungsten layer 47 is formed on piezoelectric layer 37, and contains α-phase tungsten and β-phase tungsten coexisting therein. Second tungsten layer 48 is formed on first tungsten layer 47 and is made of α-phase tungsten. Upper electrode layer 34 is formed on upper adhesion layer 35 and is made of gold (Au).

If an X axis, a Y axis and a Z axis which are orthogonal to each other are taken as shown in FIG. 1, when an AC signal is applied to driving portions 24 of detection element 21, arms 22 vibrate in the X axis direction. At this time, when an angular velocity about the Z axis occurs, Coriolis force in the Y axis direction occurs and arms 22 are bent in the Y axis direction. The bending is detected by detecting portion 25, thereby obtaining the angular velocity signal.

Hereinafter, a method of manufacturing the piezoelectric device according to the present embodiment having the above-described configuration will be described.

First, silicon oxide layer 29 made of silicon oxide (SiO$_2$) is formed on the surface of silicon layer 28 by oxidizing the surface of the substrate made of silicon layer 28. Next, Ti is formed on silicon oxide layer 29 by sputtering so as to form intermediate layer 31. By the sputtering condition at this time, Ti reacts with oxygen to become TiO$_x$ and thus a material constituting intermediate layer 31 also becomes TiO$_x$. Next, Pt and Ti are formed on intermediate layer 31 by sputtering so as to form lower electrode layer 33. Next, PLT or PLMT is formed on lower electrode layer 33 by sputtering so as to form alignment control layer 36. Next, PZT is formed on alignment control layer 36 by sputtering so as to form piezoelectric layer 37. Next, tungsten in which an α phase and a β phase coexist is formed on piezoelectric layer 37 by sputtering so as to form first tungsten layer 47. Next, α-phase tungsten is formed on first tungsten layer 47 by sputtering so as to form second tungsten layer 48. Next, Au is formed on second tungsten layer 48 by sputtering so as to form upper electrode layer 34.

In the piezoelectric device according to the present embodiment configured and manufactured as described above, since first tungsten layer 47 is made of tungsten in which an α phase and a β phase coexist, the adhesion property with piezoelectric layer 37 is improved. The reason why the adhesion property is improved will be described as follows, although not completely elucidated.

The lattice constant of PZT depends on a combination ratio of lead (Pb), zirconia (Zr) and Ti and is about 0.405 nm. Meanwhile, the lattice constant of α-phase tungsten is 0.316 nm. Since a difference between both values is large, the adhesion property is bad. However, since the lattice constant of the β-phase tungsten is 0.505 nm, the central value of the lattice constant of the α-phase tungsten and the lattice constant of the β-phase tungsten and the lattice constant of PZT are very close to each other. Accordingly, the adhesion property of first tungsten layer 47 and piezoelectric layer 37 are improved by growth from an amorphous tungsten state or fine crystals, in which an α phase and a β phase coexist, by a tuning operation from a side abutting on PZT. In addition, since tungsten in which an α phase and a β phase coexist and α-phase tungsten are different from each other in the lattice constants and are the same material, the adhesion property therebetween is high. Accordingly, the peeling of first tungsten layer 47 and second tungsten layer 48 hardly occurs.

Although, in the piezoelectric device according to the above embodiment, upper adhesion layer 35 is formed, a lower adhesion layer (not shown) may be formed between lower electrode layer 33 and piezoelectric layer 37. In this case, second tungsten layer 48 made of α-phase tungsten is formed on lower electrode layer 33, first tungsten layer 47 made of tungsten in which an α phase and a β phase coexist is formed thereon, and piezoelectric layer 37 is formed thereon. In this case, since the alignment of piezoelectric layer 37 has a large ratio depending on first tungsten layer 47, a material congenial to first tungsten layer 47 is preferably selected as piezoelectric layer 37 in terms of alignment.

Alternatively, piezoelectric layer 37 may include two layers, a material with a high adhesion property with first tungsten layer 47 may be selected as a lower layer of piezoelectric layer 37, which abuts on first tungsten layer 47, and a material with a good alignment property may be selected as an upper layer formed on the lower layer.

The lower adhesion layer may be formed together with upper adhesion layer 35. Alternatively, only the lower adhesion layer may be formed without forming upper adhesion layer 35.

In the formation of tungsten in which an α phase and a β phase coexist and the formation of α-phase tungsten, tungsten with a predetermined phase state can be obtained by controlling the temperature at the time of the film formation, the gas pressure of argon (Ar) in sputtering at the time of the film formation, and the radio frequency (RF) power and the like.

Although, in the above embodiment, upper adhesion layer 35 includes the two layers including first tungsten layer 47 and second tungsten layer 48, it may be formed of one layer in which the phase is continuously changed from tungsten in which an α phase and a β phase coexist to α-phase tungsten. In this case, the layer made of tungsten in which an α phase and a β phase coexist is set to be the portion of upper adhesion layer 35 which abuts on piezoelectric layer 37, and the layer made of the α-phase tungsten, in which the ratio of the β-phase tungsten is reduced therefrom, is set to be the portion of upper adhesion layer 35 which abuts on upper electrode layer 34.

The continuous formation of tungsten in which an α phase and a β phase coexist and α-phase tungsten is realized by controlling the temperature at the time of the film formation, the gas pressure of Ar in sputtering at the time of the film formation, and the radio frequency (RF) power and the like on the way of film formation.

As described above, according to the present embodiment, each of upper adhesion layer 35 and the lower adhesion layer includes first tungsten layer 47 made of tungsten in which an α phase and a β phase coexist and second tungsten layer 48 made of α-phase tungsten, and first tungsten layer 47 abuts on piezoelectric layer 37.

According to such a configuration, since first tungsten layer 47 has an excellent adhesion property with piezoelectric layer 37, it is possible to maintain an electrical connection property between piezoelectric layer 37 and lower electrode layer 33 or upper electrode layer 34. In addition, since the α phase has a low specific resistance, it is possible to suppress power loss to the minimum. In addition, since tungsten has little diffusion at a high temperature, the reliability under the use thereof at a high temperature can be improved.

According to the present embodiment, the portion of upper adhesion layer 35 and the lower adhesion layer, which abuts on piezoelectric layer 37, is made of tungsten in which an α phase and a β phase coexist, the ratio of β-phase tungsten is reduced as going away from piezoelectric layer 37, and the portion, which abuts on upper electrode layer 34 or lower electrode layer 33, is made of α-phase tungsten.

According to such a configuration, since tungsten in which an α phase and a β phase coexist has an excellent adhesion property with piezoelectric layer 37, it is possible to maintain an electrical connection property between piezoelectric layer 37 and lower electrode layer 33 or upper electrode layer 34. In addition, since the α phase has a low specific resistance, it is possible to suppress power loss to the minimum. In addition, since tungsten has little diffusion at a high temperature, the reliability under the use thereof at a high temperature can be improved.

Embodiment 2

Figure 3:
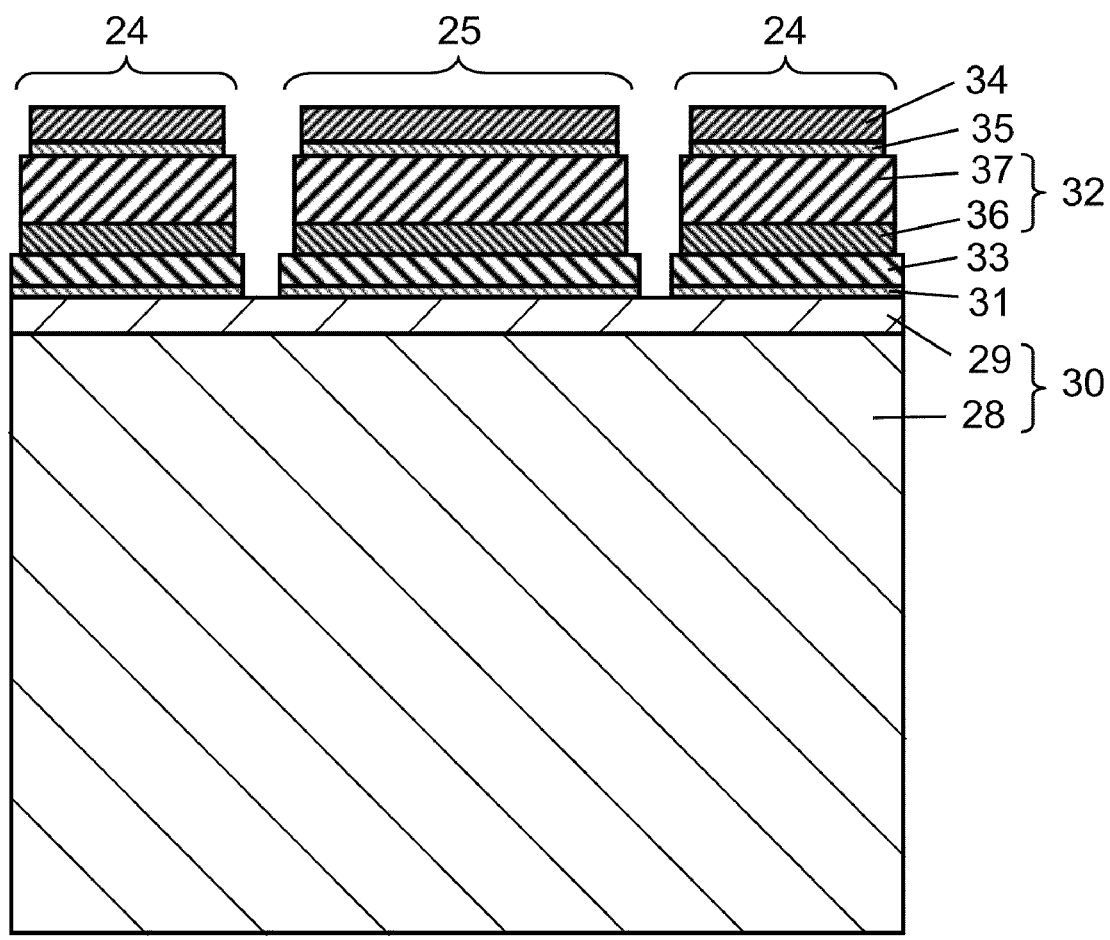
FIG. 3 is a cross-sectional view of a detection element of an angular velocity sensor as one type of a piezoelectric device according to another embodiment of the present invention.

In the present embodiment, tungsten with an extremely low reaction property with PZT, which is used as upper adhesion layer 35 in Embodiment 1, will be further examined in detail. FIG. 3 is a cross-sectional view of a sample used for examination. A method of preparing a material is as follows.

First, as shown in FIG. 3, intermediate layer 31, lower electrode layer 33, alignment control layer 36, and piezoelectric layer 37 made of PZT were successively laminated on silicon substrate 30 with a wafer shape. Thereafter, tungsten was formed as upper adhesion layer 35 by a sputtering method in a state in which silicon substrate 30 is heated to 150° C. In addition, upper electrode layer 34 was laminated on upper adhesion layer 35.

Figure 4:
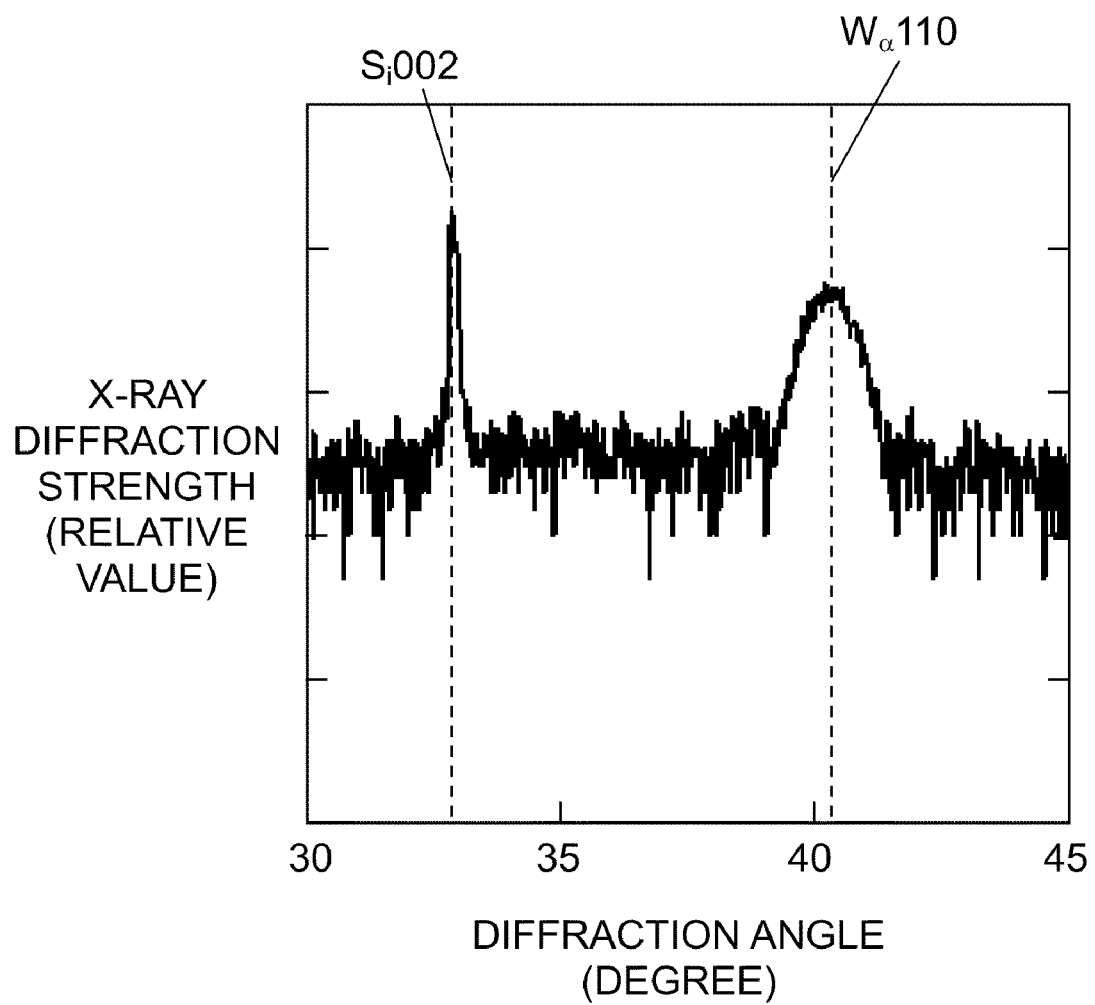
FIG. 4 is a characteristic diagram showing X-ray diffraction measurement results after forming film of an adhesion layer in an angular velocity sensor manufactured for examination.

The result of measuring the crystallinity of the tungsten film of upper adhesion layer 35 after sputtering by an X-ray diffraction method using 2θ and $CuK_\alpha$ is shown in FIG. 4. In FIG. 4, a horizontal axis denotes a diffraction angle and a vertical axis denotes a relative value of X-ray diffraction strength. It is known that tungsten transitions from a β phase with a high specific resistance to an α phase with a low specific resistance about 100° C. In addition, it can be seen that the tungsten film obtained herein is α phase, from a peak with large diffraction strength of FIG. 4 corresponding to α-phase tungsten $W_\alpha$ (110).

Next, driving portions 24, detecting portion 25 and monitor portion 26, having a predetermined shape, were formed by performing dry etching and wet etching using a photolithography method. Thereafter, a polarization process and an annealing process were performed so as to stabilize piezoelectric characteristics.

Next, silicon substrate 30 with the wafer shape was dry etched so as to form a plurality of tuning fork type detection elements 21, and dicing was performed such that individual detection elements 21 were divided.

Figure 5:
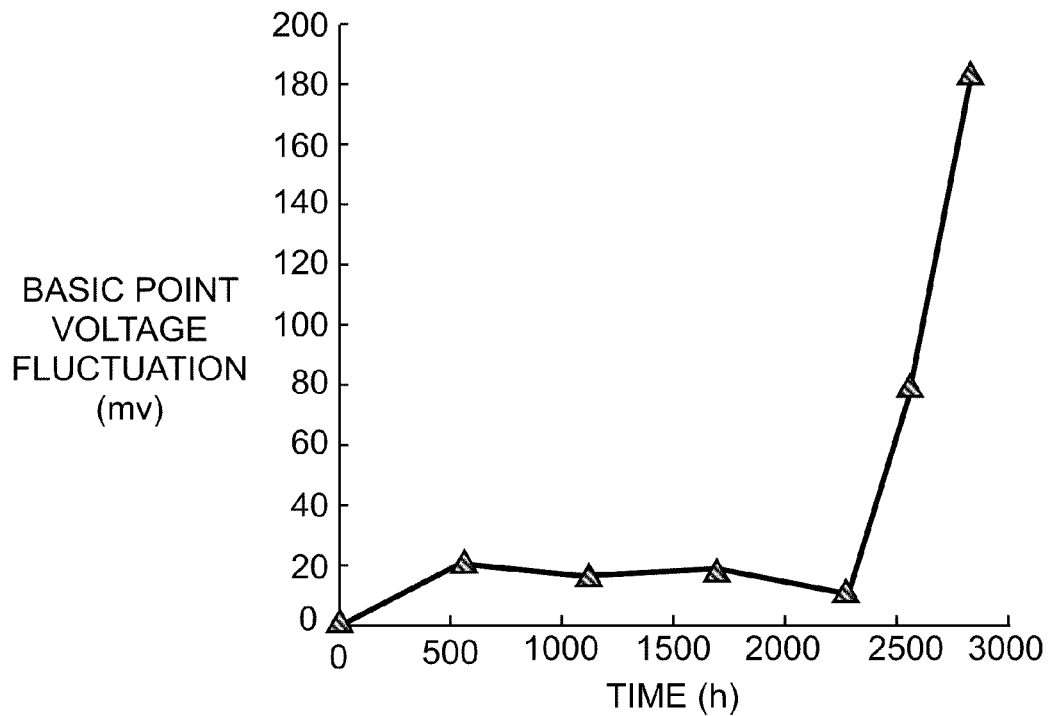
FIG. 5 is a characteristic diagram showing a change in the basic point voltage fluctuation of the same angular velocity sensor at a high temperature with the elapse of time.

In the angular velocity sensor using the detection element having such a configuration, it can be seen that a basic point voltage fluctuation at the time of the continuous operation at a high temperature (at the time of the operation of 5 V at 125 degrees) is significantly improved compared with the conventional angular velocity sensor, as shown in FIG. 5, but an operation time is rapidly increased from a time point exceeding 2000 hours and thus long-term reliability is lowered.

Accordingly, in the present embodiment, a material was prepared by the following method. The method includes a step of forming a lower electrode layer above a substrate, a step of forming a piezoelectricity layer on the lower electrode layer, a step of forming an upper electrode layer above the piezoelectricity layer, and a step of forming an upper adhesion layer between the piezoelectricity layer and the upper electrode layer. The step of forming the upper adhesion layer is performed by depositing tungsten without heating the substrate so as to form the upper adhesion layer made of β-phase tungsten and heating the upper adhesion layer made of β-phase tungsten so as to transition to an adhesion layer made of α-phase tungsten.

According to this manufacturing method, when the upper adhesion layer located between the piezoelectricity layer and the upper electrode layer is formed, since tungsten is deposited without heating the substrate so as to form the upper adhesion layer made of β-phase tungsten, it is possible to suppress the interaction of tungsten constituting the upper electrode layer and the material constituting the piezoelectricity layer. Accordingly, since the basic point voltage fluctuation at the time of the high-temperature operation can be suppressed to a low level over a long period of time, it is possible to provide a piezoelectric device such as an angular velocity sensor with high reliability at a high temperature. In addition, since the adhesion layer made of β-phase tungsten is heated so as to transition to the adhesion layer made of α-phase tungsten, the adhesion property with the piezoelectricity layer can be improved.

In particular, by heating the upper adhesion layer made of β-phase tungsten in a range of 150° C. to 300° C., it is possible to improve the adhesion property between the upper adhesion layer and the piezoelectricity layer and to prevent the deterioration of the piezoelectricity layer from progressing due to the interaction therebetween.

Hereinafter, an angular velocity sensor as one type of the piezoelectric device according to the present embodiment will be described with reference to the drawings.

The perspective view of a detection element of the angular velocity sensor as one type of the piezoelectric device according to the present embodiment is equivalent to FIG. 1. The cross-sectional configuration of the detection element of the angular velocity sensor as one type of the piezoelectric device according to the present embodiment is equivalent to FIG. 3.

Even in the present embodiment, each of the pair of arms 22 has silicon substrate 30 having two layers including silicon layer 28 and silicon oxide layer 29 obtained by oxidizing the surface thereof, as shown in FIG. 3. Driving portions 24 and detecting portion 25 are formed on silicon substrate 30 with adhesion layer 31 interposed therebetween. Each of driving portions 24 and detecting portion 25 includes lower electrode layer 33 and upper electrode layer 34 with piezoelectricity layer 32 interposed therebetween. Upper adhesion layer 35 is formed between piezoelectricity layer 32 and upper electrode layer 34.

In the present embodiment, upper adhesion layer 35 is made of Ti, and lower electrode layer 33 is made of Pt—Ti mainly made of platinum containing Ti. Piezoelectricity layer 32 includes two layers including alignment control layer 36 mainly made of lead titanate and piezoelectric layer 37 made of a piezoelectric material containing lead laminated on alignment control layer 36. Upper adhesion layer 35 is made of tungsten, and upper electrode layer 34 is made of Au. Lanthanum-magnesium-added lead titanate or lead lanthanum titanate may be used as alignment control layer 36. PZT, PLZT, or the like, may be used as piezoelectric layer 37 made of a piezoelectric material containing lead.

Next, a method of manufacturing detection element 21 according to the present embodiment will be described.

First, Ti is sputtered on wafer-shaped silicon substrate 30 having silicon oxide layer 29 on the surface thereof so as to form adhesion layer 31.

Next, Ti and Pt are simultaneously sputtered on adhesion layer 31 as a target so as to form lower electrode layer 33.

Next, lanthanum-magnesium-added lead titanate or lead lanthanum titanate is sputtered on lower electrode layer 33 so as to form alignment control layer 36.

Next, PZT is sputtered on alignment control layer 36 so as to form piezoelectric layer 37.

Next, tungsten is deposited (hereinafter, referred to as "sputtered") on piezoelectric layer 37 as a target so as to form upper adhesion layer 35 made of β-phase tungsten. In order to form β-phase tungsten, the temperature of the silicon substrate 30 with the wafer shape needs to be maintained at a transition temperature (about 100° C.) or less from the β phase to the αphase. In this case, in the present embodiment, sputtering is performed without heating silicon substrate 30 with the wafer shape. At this time, the temperature of silicon substrate 30 is increased to about 60° C. by the radiation heat of the sputtering. After film of upper adhesion layer 35 made of β-phase tungsten is formed, a heating treatment is performed at 180° C. for 2 hours during vacuum in a sputtering device. By this heating treatment, β-phase tungsten transitions to α-phase tungsten with a lower specific resistance. This heating treatment is preferably performed in a range of 150° C. to 300° C., as can be seen from the below-described reason.

Next, Au is sputtered on upper adhesion layer 35 so as to form upper adhesion layer 34.

Figure 6:
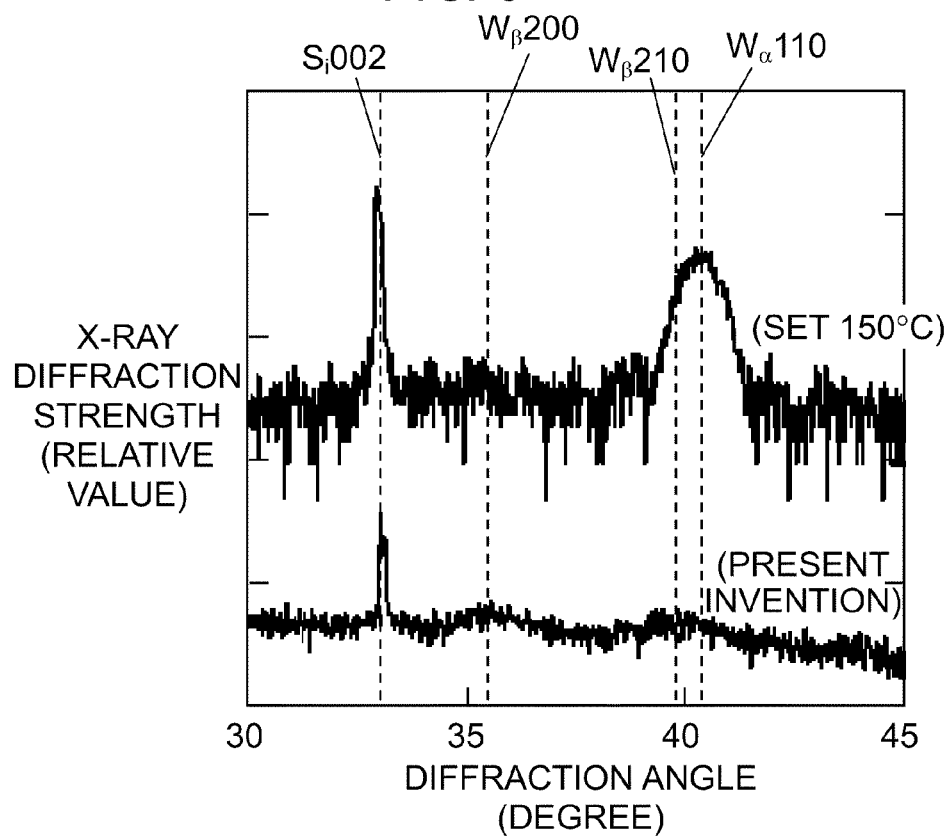
FIG. 6 is a characteristic diagram showing X-ray diffraction measurement results after forming film of an adhesion layer in an angular velocity sensor according to another embodiment of the present invention.

After the film is formed by sputtering, similar to FIG. 4, the result of measuring the crystallinity of the tungsten film before the heating treatment by an X-ray diffraction method is shown in FIG. 6. The lower data of FIG. 6 denotes the crystallinity of the tungsten film according to the present embodiment, and, as can be seen from FIG. 6, a peak corresponding to α-phase tungsten $W_\alpha$ (110) does not appear. Meanwhile, it can be seen from peaks corresponding to β-phase tungsten $W_\beta$ (200) and $W_\beta$ (210) that the tungsten film obtained herein is β phase. The upper data of FIG. 6 denotes the crystallinity of the tungsten film formed by setting the temperature of the substrate to 150° C. and is the data of FIG. 4 which is recorded again for comparison.

Next, driving portions 24, detecting portion 25 and monitor portion 26 having a predetermined shape and routed signal line portions 27 extending therefrom were first formed by performing dry etching using a photolithography method. At this time, a portion of signal line portions 27 is not completely etched and the driving portions, or the like, are electrically connected to ground through that portion.

Next, wet etching is performed and a portion of signal line portions 27 is removed so as to form signal line portions 27 with a predetermined shape. Next, a polarization process and an annealing process are performed so as to stabilize piezoelectric characteristics.

Next, silicon substrate 30 with the wafer shape is dry etched so as to form a plurality of tuning fork type detection elements 21, and dicing is performed such that individual detection elements 21 are divided.

Figure 7:
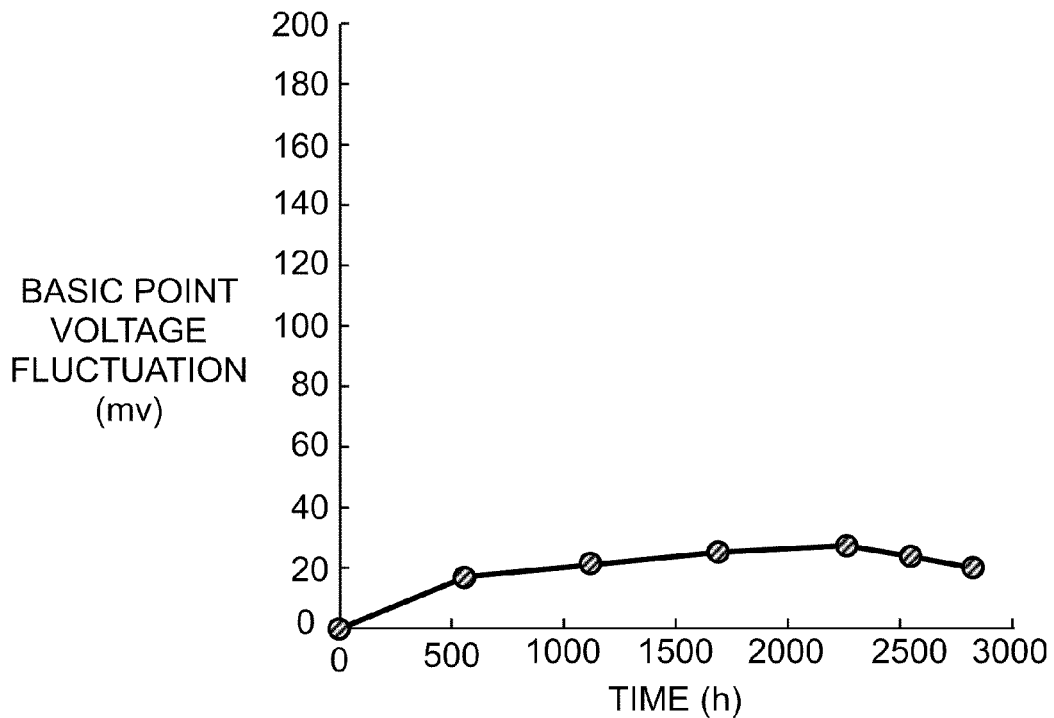
FIG. 7 is a characteristic diagram showing a change in the basic point voltage fluctuation of the angular velocity sensor according to the embodiment at a high temperature with the elapse of time.

In the angular velocity sensor using detection element 21, as shown in FIG. 7, even when the operation time at the time of the high-temperature operation (at the time of the operation of 5V at 125 degrees Celsius) is increased to, for example, 2000 hours or more, the basic point voltage fluctuation is maintained at a low level. That is, since the basic point voltage fluctuation at the time of the high-temperature operation can be suppressed to a low level over a long period of time, it is possible to obtain an angular velocity sensor with high reliability at a high temperature.

The reason why the basic point voltage fluctuation is maintained at the low level at the time of the high-temperature operation over the long period of time in the angular velocity sensor according to the embodiment configured and manufactured as described above is as follows.

In order to stabilize the characteristics of the angular velocity sensor, the interaction between upper adhesion layer 35 made of tungsten and piezoelectric layer 37 abutting on and made of PZT is suppressed and the adhesion property needs to be maintained. If the substrate is heated when film of upper adhesion layer 35 is formed by the sputtering method, piezoelectric layer 37 simultaneously receives high energy applied to deposited particles by the sputtering method and heat energy from the substrate. As a result, the interaction of tungsten constituting piezoelectric layer 37 and upper adhesion layer 35 cannot be suppressed and the deterioration of the sensor characteristics is accelerated.

In contrast, in the present embodiment, since silicon substrate 30 with the wafer shape is not heated when upper adhesion layer 35 made of tungsten is formed by the sputtering method, the interaction of tungsten constituting upper adhesion layer 35 and material constituting piezoelectric layer 37 can be suppressed. Since only the heating is performed after forming the film so as to improve the adhesion property, it is possible to improve the adhesion property while suppressing the interaction of tungsten constituting upper adhesion layer 35 and material constituting piezoelectric layer 37. Accordingly, it is possible to stabilize the characteristics of the sensor.

Next, a preferable temperature range of the heating treatment performed after forming upper adhesion layer 35 will be described.

Figure 8:
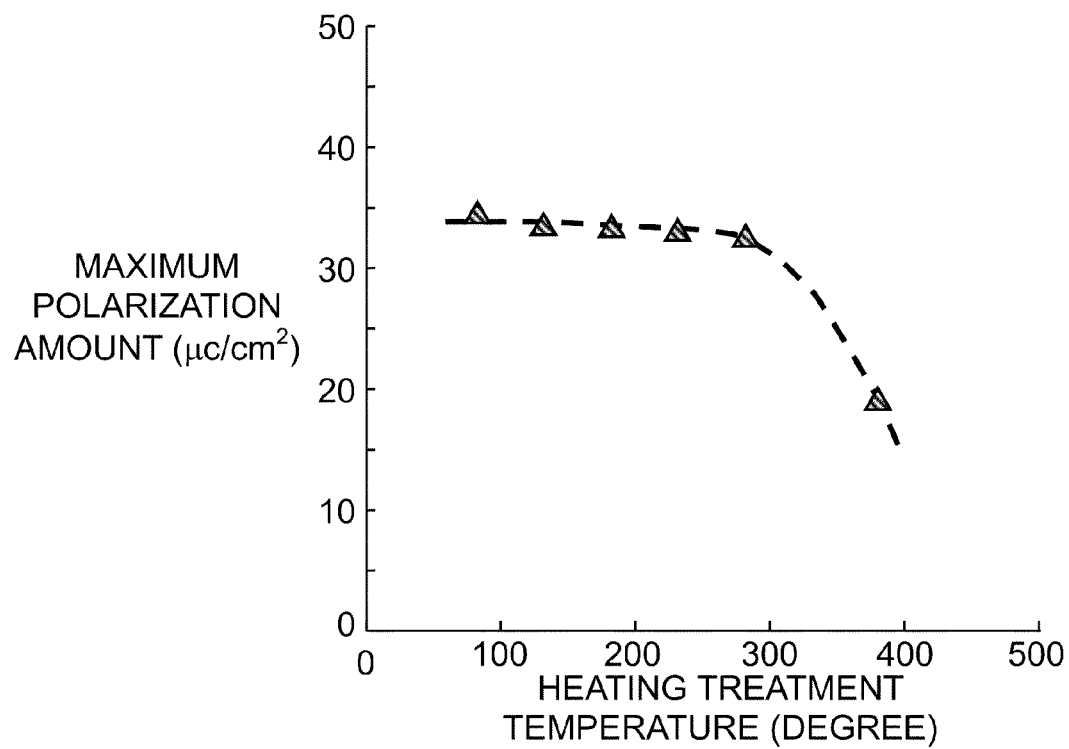
FIG. 8 is a characteristic diagram showing a relationship between a maximum polarization amount and a heating treatment temperature of an upper adhesion layer of the angular velocity sensor according to the same embodiment.

FIG. 8 shows a relationship between the maximum polarization amount of piezoelectricity layer 32 and the temperature of the heating treatment performed after forming upper adhesion layer 35. The maximum polarization amount is a maximum polarization amount (a dipole moment per unit volume) generated in a state of applying a voltage to piezoelectricity layer 32. It can be seen from FIG. 8 that, if the heating treatment temperature exceeds 300° C., the maximum polarization amount is largely lowered. Tungsten constituting upper adhesion layer 35 and PZT constituting piezoelectric layer 37 of piezoelectricity layer 32 interact with each other such that the deterioration of piezoelectricity layer 32 progresses. Accordingly, the heating treatment temperature is preferably 300° C. or less.

FIGS. 9A to 9E show the experimental results showing the relationship between the adhesion property between upper adhesion layer 35 and piezoelectric layer 37 of piezoelectricity layer 32 and the temperature of the heating treatment performed after film of upper adhesion layer 35 is formed. In these experiments, upper adhesion layer 35 subjected to the heating treatment at various temperatures is prepared, scribing line 91 is drawn on film of upper adhesion layer 35 using a diamond indenter, and, after an adhesion tape is adhered thereon, the tape is peeled.

Figure 9A:
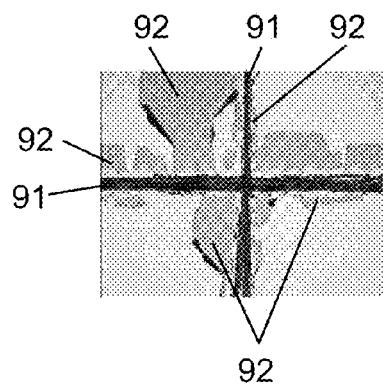
FIG. 9A is a view showing a relationship between an adhesion property and a heating treatment temperature of an upper adhesion layer of the angular velocity sensor according to the same embodiment.
Figure 9B:
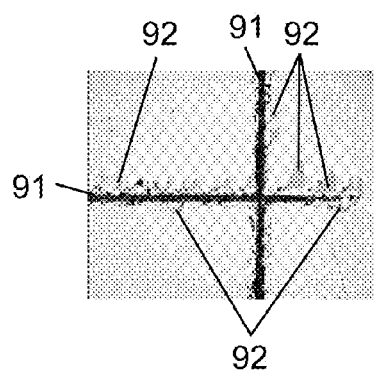
FIG. 9B is a view showing a relationship between an adhesion property and a heating treatment temperature of an upper adhesion layer of the angular velocity sensor according to the same embodiment.
Figure 9C:
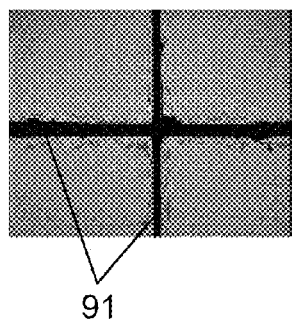
FIG. 9C is a view showing a relationship between an adhesion property and a heating treatment temperature of an upper adhesion layer of the angular velocity sensor according to the same embodiment.
Figure 9D:
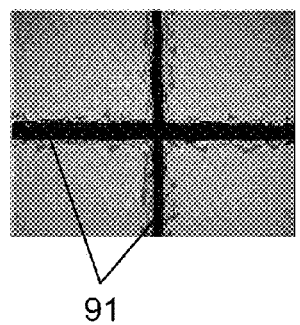
FIG. 9D is a view showing a relationship between an adhesion property and a heating treatment temperature of an upper adhesion layer of the angular velocity sensor according to the same embodiment.
Figure 9E:
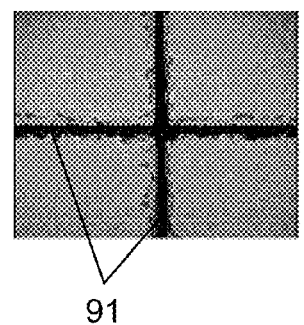
FIG. 9E is a view showing a relationship between an adhesion property and a heating treatment temperature of an upper adhesion layer of the angular velocity sensor according to the same embodiment.
Figure 10:
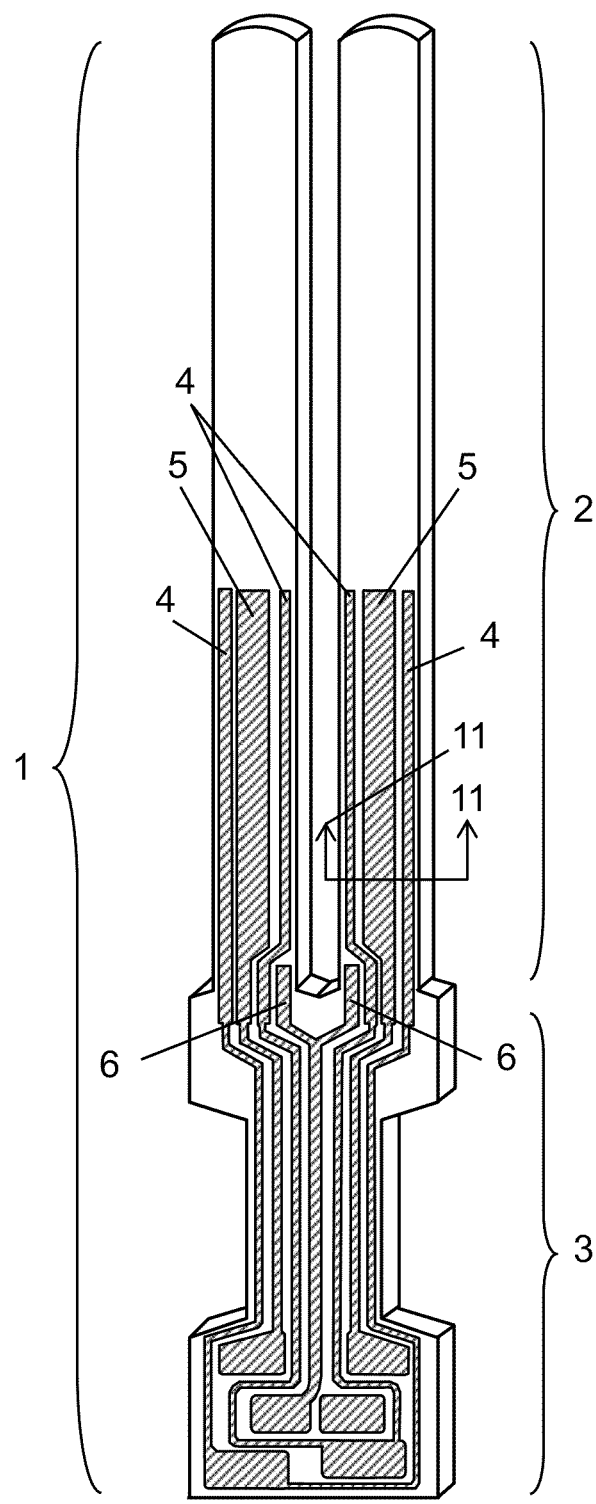
FIG. 10 is a perspective view of a detection element of an angular velocity sensor as one type of a conventional piezoelectric device.
Figure 11:
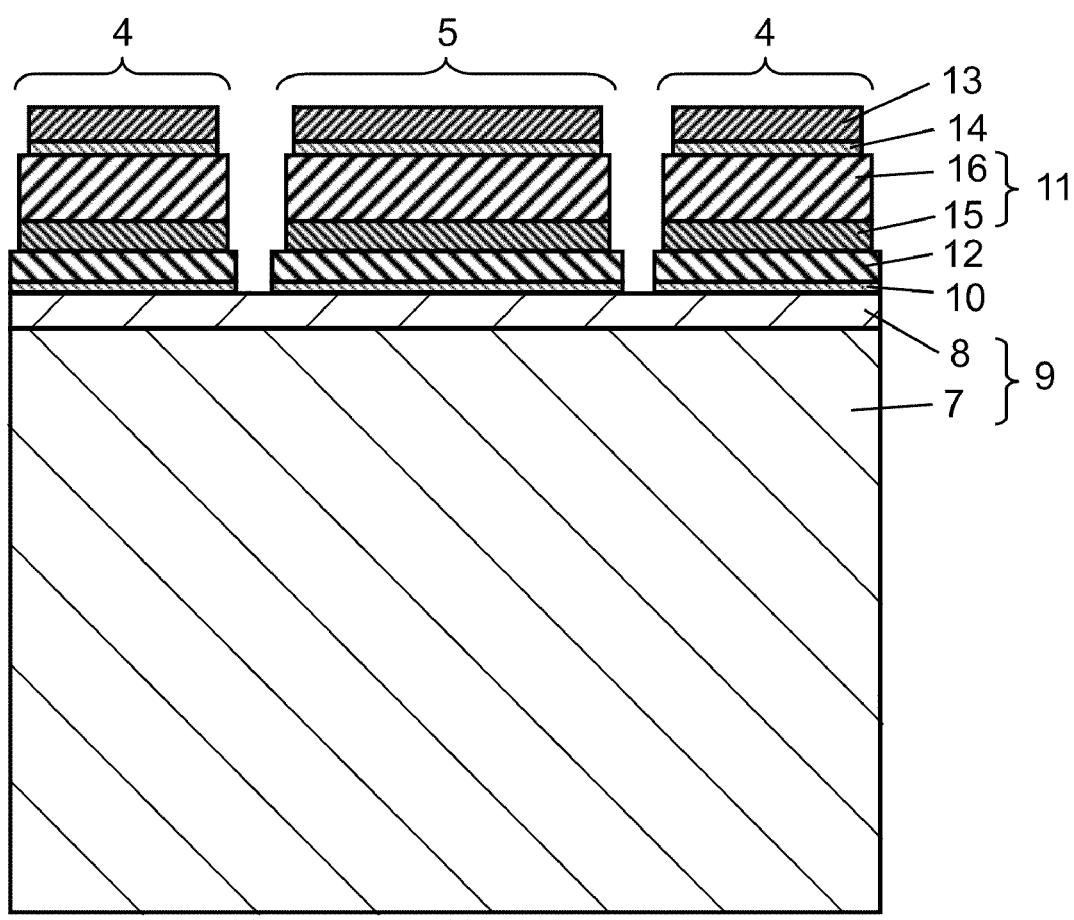
FIG. 11 is a cross-sectional view taken along line 11-11 of FIG. 10.
Figure 12:
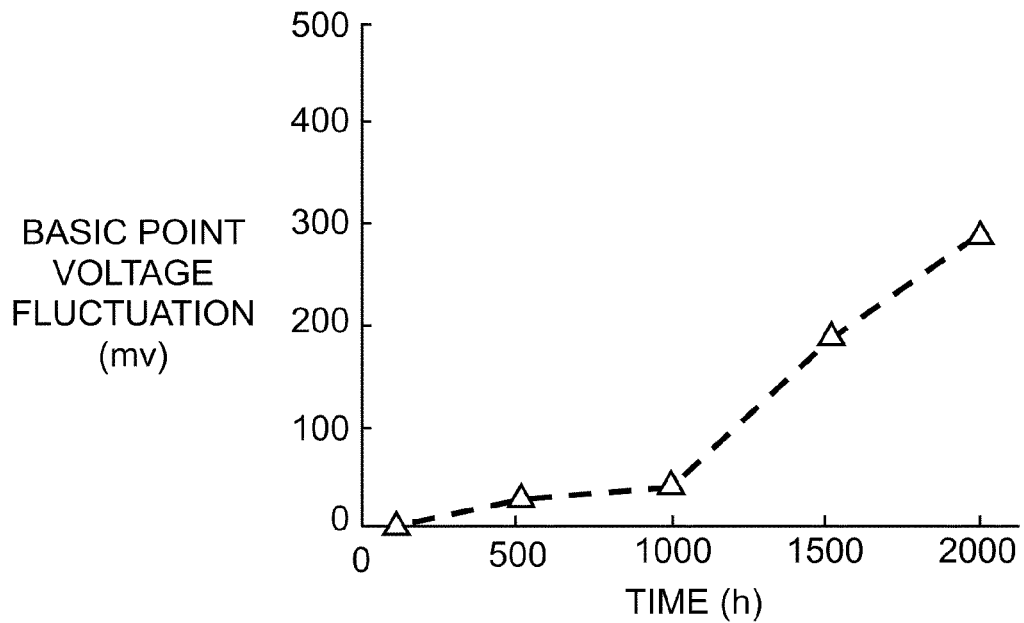
FIG. 12 is a characteristic diagram showing a change in basic point voltage fluctuation of the same angular velocity sensor at a high temperature with the elapse of time.
Figure 13:
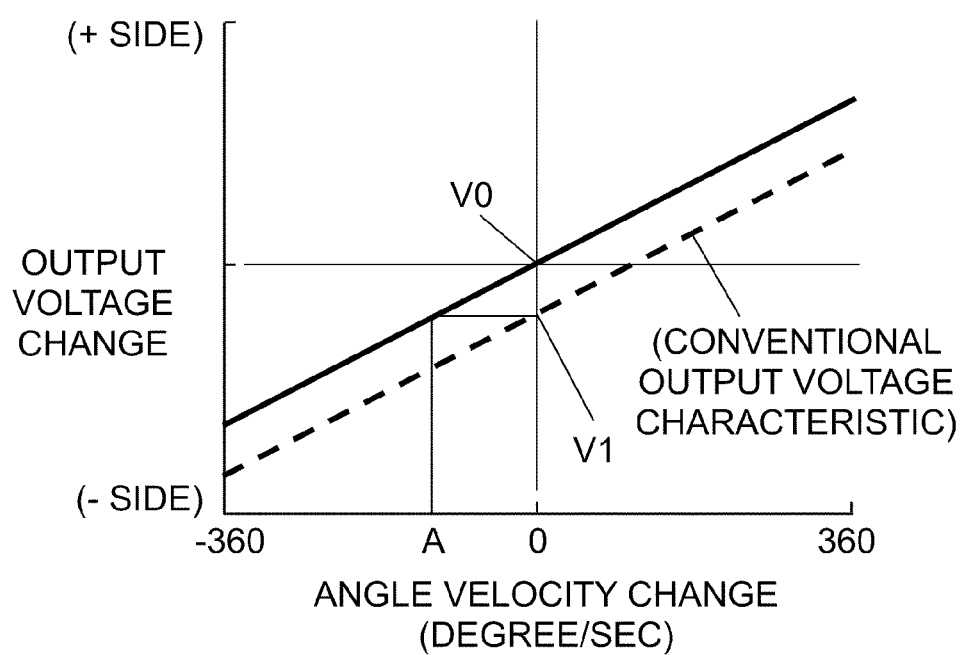
FIG. 13 is a characteristic diagram showing an output voltage change against an angular velocity change of the same angular velocity sensor.

FIG. 9A shows the case where the heating treatment is not performed, FIG. 9B shows the case where the heating treatment temperature is 100° C., FIG. 9C shows the case where the heating treatment temperature is 150° C., FIG. 9D shows the case where the heating treatment temperature is 180° C., and FIG. 9E shows the case where the heating treatment temperature is 210° C.

As can be seen from FIGS. 9A to 9E, in the case where the heating treatment temperature is 100° C. or less as shown in FIGS. 9A and 9B, upper adhesion layer 35 is largely peeled off using scribing line 91 as a starting point and a plurality of large and small peeling portions 92 are generated. Accordingly, in this case, it can be seen that the adhesion property is insufficient. In contrast, in the case where the heating treatment temperature is 150° C. or more as shown in FIGS. 9C to 9E, the peeling from the periphery of scribing line 91 hardly occurs. Accordingly, the heating treatment temperature is preferably 150° C. or more because the adhesion property is high.

As described above, the present embodiment includes a step of forming lower electrode layer 33 above silicon substrate 30 with the wafer shape, a step of forming piezoelectricity layer 32 above lower electrode layer 33, a step of forming upper electrode layer 34 above piezoelectricity layer 32, and a step of forming upper adhesion layer 35 between piezoelectricity layer 32 and upper electrode layer 34. The step of forming upper adhesion layer 35 is performed by depositing tungsten without heating silicon substrate 30 with the wafer shape so as to form adhesion layer 35 made of β-phase tungsten and heating adhesion layer 35 made of β-phase tungsten so as to transition to adhesion layer 35 made of α-phase tungsten.

Accordingly, when upper adhesion layer 35 located between piezoelectricity layer 32 and upper electrode layer 34 is formed, since tungsten is deposited without heating silicon substrate 30 with the wafer shape so as to form upper adhesion layer 35 made of β-phase tungsten, it is possible to suppress the interaction of tungsten constituting upper electrode layer 34 and material constituting piezoelectric layer 37 constituting a portion of piezoelectricity layer 32. Accordingly, since the basic point voltage fluctuation at the time of the high-temperature operation can be suppressed to a low level over a long period of time, it is possible to provide a piezoelectric device such as an angular velocity sensor with high reliability at the high temperature. In addition, since upper adhesion layer 35 made of β-phase tungsten is heated so as to transition to upper adhesion layer 35 made of α-phase tungsten, the adhesion property with piezoelectric layer 37 constituting the portion of piezoelectricity layer 32 can be improved.

Although, in the present embodiment, upper adhesion layer 35 is formed on piezoelectric layer 37, the same effect can be obtained when a lower adhesion layer (not shown) may be formed after lower electrode layer 33 is formed before forming piezoelectric layer 37. That is, the lower adhesion layer (not shown) made of β-phase tungsten is formed by depositing tungsten without heating silicon substrate 30 after forming lower electrode layer 33. Thereafter, the lower adhesion layer made of β-phase tungsten is heated so as to transition to the lower adhesion layer made of α-phase tungsten. Thereafter, piezoelectric layer 37 is formed on the lower adhesion layer.

Accordingly, it is possible to suppress the interaction of tungsten constituting the lower electrode layer and the material of piezoelectric layer 37 and to suppress the basic point voltage fluctuation at the time of the high-temperature operation suppressed to a low level over a long period of time. In addition, the adhesion property with piezoelectric layer 37 constituting the portion of piezoelectricity layer 32 can be improved.

The present invention is particularly applicable to vehicles or various electrical apparatuses such as a head for an ink jet printer or an inertia sensor including an angular velocity sensor, which can improve the reliability in use thereof at a high temperature.

The invention claimed is:

1. A piezoelectric device comprising:
   a substrate;
   a lower electrode layer formed on the substrate;
   a piezoelectricity layer formed on the lower electrode layer;
   an upper electrode layer formed on the piezoelectricity layer; and
   and at least one of a lower adhesion layer formed between the piezoelectricity layer and the lower electrode layer so as to abut on the piezoelectricity layer and the lower electrode layer or an upper adhesion layer formed between the piezoelectricity layer and the upper electrode layer so as to abut on the piezoelectricity layer and the upper electrode layer;
   wherein each of the upper adhesion layer and the lower adhesion layer includes a first tungsten layer made of tungsten in which an α phase and a β phase coexist and a second tungsten layer made of α-phase tungsten, and the first tungsten layer is configured so as to abut on the piezoelectricity layer.

2. A piezoelectric device comprising:
   a substrate;
   a lower electrode layer formed on the substrate;
   a piezoelectricity layer formed on the lower electrode layer;
   an upper electrode layer formed on the piezoelectricity layer; and
   at least one of a lower adhesion layer formed between the piezoelectricity layer and the lower electrode layer so as to abut on the piezoelectricity layer and the lower electrode layer or an upper adhesion layer formed between the piezoelectricity layer and the upper electrode layer so as to abut on the piezoelectricity layer and the upper electrode layer;

wherein a portion of the upper adhesion layer and the lower adhesion layer, which abuts on the piezoelectricity layer, is made of tungsten in which an α phase and a β phase coexist, a ratio of tungsten of β phase is reduced as going away from the piezoelectricity layer, and a portion which abuts on the upper electrode layer or the lower electrode layer is made of α-phase tungsten.

3. A piezoelectric device comprising:
a substrate;
a lower electrode layer formed on the substrate;
a piezoelectricity layer formed on the lower electrode layer;
an upper electrode layer formed on the piezoelectricity layer; and
at least one of a lower adhesion layer formed between the piezoelectricity layer and the lower electrode layer so as to abut on the piezoelectricity layer and the lower electrode layer or an upper adhesion layer formed between the piezoelectricity layer and the upper electrode layer so as to abut on the piezoelectricity layer and the upper electrode layer;
wherein the upper adhesion layer and the lower adhesion layer are configured by the transition of β-phase tungsten formed without heating the substrate into α-phase tungsten.

* * * * *